United States Patent
Choi et al.

(10) Patent No.: US 11,170,825 B2
(45) Date of Patent: Nov. 9, 2021

(54) DATA RECEIVING DEVICES, MEMORY DEVICES HAVING THE SAME, AND OPERATING METHODS THEREOF

(71) Applicant: Samsung Electronics Co., Ltd., Suwon-si (KR)

(72) Inventors: Jaemin Choi, Suwon-si (KR); Daehyun Kwon, Suwon-si (KR); Buyeon Lee, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/930,561

(22) Filed: Jul. 16, 2020

(65) Prior Publication Data

US 2021/0174844 A1 Jun. 10, 2021

(30) Foreign Application Priority Data

Dec. 10, 2019 (KR) .......................... 10-2019-0163805

(51) Int. Cl.
| | | |
|---|---|---|
| *G11C 7/02* | (2006.01) | |
| *G11C 7/06* | (2006.01) | |
| *G11C 7/10* | (2006.01) | |
| *G11C 16/24* | (2006.01) | |
| *G11C 16/08* | (2006.01) | |
| *G11C 7/22* | (2006.01) | |

(52) U.S. Cl.
CPC .............. *G11C 7/065* (2013.01); *G11C 7/106* (2013.01); *G11C 7/1069* (2013.01); *G11C 7/1087* (2013.01); *G11C 7/222* (2013.01); *G11C 16/08* (2013.01); *G11C 16/24* (2013.01)

(58) Field of Classification Search
CPC ..................................................... G11C 7/065
USPC .......................................................... 365/207
See application file for complete search history.

(56) References Cited

U.S. PATENT DOCUMENTS

| | | |
|---|---|---|
| 7,271,623 B2 | 9/2007 | Palmer |
| 7,443,913 B2 | 10/2008 | Bhakta et al. |
| 7,701,257 B2 | 4/2010 | Bae |
| 8,798,530 B2 | 8/2014 | Chow et al. |
| 9,049,075 B2 | 6/2015 | Juenemann et al. |
| 9,209,948 B2 | 12/2015 | Atwood et al. |
| 9,231,793 B1 | 1/2016 | Vareljian et al. |
| 2010/0060765 A1* | 3/2010 | Kim ...................... G11C 7/065 348/308 |
| 2019/0164594 A1 | 5/2019 | Eom et al. |

FOREIGN PATENT DOCUMENTS

KR 10-2009-0077155 A1 7/2009

* cited by examiner

*Primary Examiner* — Hoai V Ho
(74) *Attorney, Agent, or Firm* — Myers Bigel, P.A.

(57) ABSTRACT

A data receiving device of a memory device comprises a first pre-amplifier configured to receive previous data, a first reference voltage, and input data, and to output differential signals by comparing the input data with the first reference voltage in response to a clock, when the first pre-amplifier is selected in response to the previous data, a second pre-amplifier configured to receive inverted previous data, a second reference voltage, different from the first reference voltage, and the input data, and outputting a common signal in response to the clock, when the second pre-amplifier is unselected in response to the previous data; and an amplifier configured to receive the differential signals and the common signal, and to latch the input data by amplifying the differential signals.

20 Claims, 12 Drawing Sheets

DATA RECEIVING DEVICES, MEMORY DEVICES HAVING THE SAME, AND OPERATING METHODS THEREOF

CROSS-REFERENCE TO RELATED APPLICATION(S)

This application claims the benefit of priority to Korean Patent Application No. 10-2019-0163805, filed on Dec. 10, 2019 in the Korean Intellectual Property Office, the disclosure of which is incorporated herein by reference in its entirety.

BACKGROUND

1. Field

The present disclosure relates to data receiving devices and memory devices having the same.

2. Description of Related Art

In general, as semiconductor technology develops, a clock frequency increases and a data rate increases. Moreover, as the data rate between a memory and a memory controller increases, distortion may occur in a waveform of data transmitted through a data channel. One of the causes of such distortion is intersymbol interference (ISI). ISI refers to a phenomenon in which previously-transmitted data affects transmission data currently transmitted due to a limitation of a bandwidth of a data channel. One widely used technique for reducing the ISI effect is the use of a decision feedback equalizer (DFE), which may be a circuit/filter that uses previous data (e.g., previous symbol decisions) to reduce ISI.

SUMMARY

An aspect of the present inventive concept is to provide a data receiving device for reducing ISI, a memory device having the same, and an operating method thereof.

According to an aspect of the present inventive concept, a data receiving device of a memory device may include: a first pre-amplifier receiving previous data, a first reference voltage, and input data and outputting differential signals by comparing the input data with the first reference voltage in response to a clock when the first pre-amplifier is selected in response to the previous data; a second pre-amplifier receiving inverted previous data, a second reference voltage, different from the first reference voltage, and the input data and outputting a common signal in response to the clock when the second pre-amplifier is unselected in response to the previous data; and an amplifier receiving the differential signals and the common signal, and latching the input data by amplifying the differential signals.

According to an aspect of the present inventive concept, a memory device may include: a memory cell array having a plurality of memory cells at intersections of a plurality of word lines and a plurality of bit lines; a row decoder selecting any one of the plurality of word lines in response to a row address; a bit line sense amplifying circuit configured to sense and to amplify data from selected ones of the plurality of memory cells during a reading operation; a column driver selecting bit lines among the plurality of bit lines in response to a column address; and a data input/output device receiving data from the bit line sense amplifying circuit during the reading operation, and receiving input data from data pads during a writing operation. The data input/output device may include at least one respective data input sense amplifier connected to each of the data pads, and the at least one respective data input sense amplifier may include a first stage that is configured to output differential signals by amplifying the input data using a reference voltage selected in response to previous data, and a second stage that is configured to latch the input data by amplifying the differential signals.

According to an aspect of the present inventive concept, an operating method of a data receiving device having a first stage and a second stage may include receiving previous data from another data receiving device; activating a first pre-amplifier in response to the previous data in the first stage; and amplifying differential signals output from the first pre-amplifier in the second stage.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, example embodiments of the present inventive concept will be described clearly and in detail with reference to the accompanying drawings.

Figure 1:
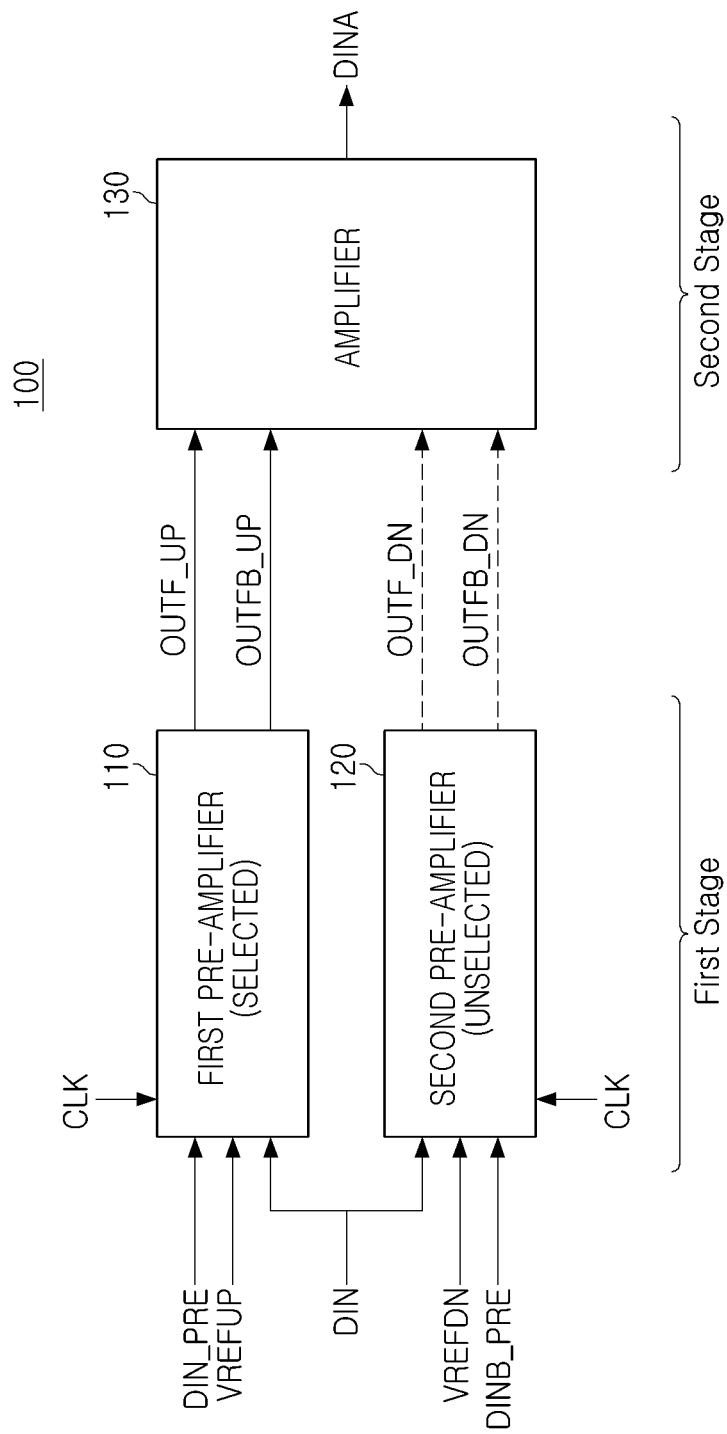
FIG. 1 is a view illustrating a data receiving device according to an example embodiment of the present inventive concept.

FIG. 1 is a view illustrating a data receiving device 100 according to an example embodiment of the present inventive concept. Referring to FIG. 1, the data receiving device 100 may include a first pre-amplifier 110, a second pre-amplifier 120, and an amplifier 130.

The first pre-amplifier 110 and the second pre-amplifier 120 may determine whether to select according to (e.g., in response to) previous data DIN_PRE and DINB_PRE. That is, any one of the first pre-amplifier 110 and the second pre-amplifier 120 may be selected according to the previous data DIN_PRE and DINB_PRE, and the other may be unselected. In the following description, it is assumed that the first pre-amplifier 110 is selected and the second pre-amplifier 120 is unselected for convenience of description.

The first pre-amplifier 110 may be configured (i) to be selected according to the previous data DIN_PRE, (ii) to compare data DIN with a first reference voltage VREFUP in response to a clock CLK, and (iii) to output signals OUT-F_UP and OUTFB_UP corresponding to a comparison result (i.e., in response to comparing the data DIN with the first reference voltage VREFUP).

The second pre-amplifier 120 may be configured (a) to be selected according to the inverted previous data DINB_PRE, (b) to compare data DIN with a second reference voltage VREFDN in response to a clock CLK, and (c) to output signals OUTF_DN and OUTFB_DN corresponding to a comparison result. Here, the second reference voltage VREFDN may be different from the first reference voltage VREFUP. For example, the second reference voltage VREFDN may be lower than the first reference voltage VREFUP.

The amplifier 130 may be configured to receive any one of the output signals OUTF_UP and OUTFB_UP of the first pre-amplifier 110 and the output signals OUTF_DN and OUTFB_DN of the second pre-amplifier 120, and to output amplified data DINA in response to the received output signals.

As shown in FIG. 1, the data receiving device 100 may be implemented with two-stage sense amplifiers. A first stage is a circuit that provides amplification by any one of the first and second pre-amplifiers 110 and 120, and a second stage is a circuit amplifying a signal amplified in the first stage.

The first stage may select a reference voltage according to the previous data DINP_PRE and DINB_PRE. For example, the first reference voltage VREFUP may be selected according to the previous data DIN_PRE, and the second reference voltage VREFDN may be selected according to the previous data DINB_PRE. Here, the previous data DIN_PRE and the previous data DINB_PRE are complementary data. For example, when the previous data DIN_PRE is '1', the first preamplifier 110 may be activated, so that the first reference voltage VREFUP may be selected in the first stage. In addition, when the previous data DINB_PRE is '1', the second pre-amplifier 120 may be activated, so that the second reference voltage VREFDN may be selected in the first stage. However, it should be understood that selection of the reference voltage in the first stage of the present inventive concept is not limited thereto.

In an example embodiment, the first stage may use a switch to remove (e.g., disconnect) a differential signal of one input pair without a stack of transistors. An input pair transmitting a differential signal to the second stage may allow a current source to flow current first to help charge and drive an internal node.

The second stage may receive the differential signal of the first stage and amplify and output the corresponding data.

In general, DFE tap weight should be controllable over a constant and wide range for process, voltage, temperature (PVT) variations. In a two-stage amplifier operating at a low voltage, a circuit performance may be significantly degraded due to the stack of transistors. This makes it difficult to implement decision logic.

On the other hand, in the data receiving device 100 according to an example embodiment of the present inventive concept, selection by the DFE operation can be implemented as/by a switch connected in parallel to the input pair instead of a transistor connected in series. Non-ideal operating characteristics of this switch can be improved by weakly pre-charging the selected input pair.

Figure 2A:
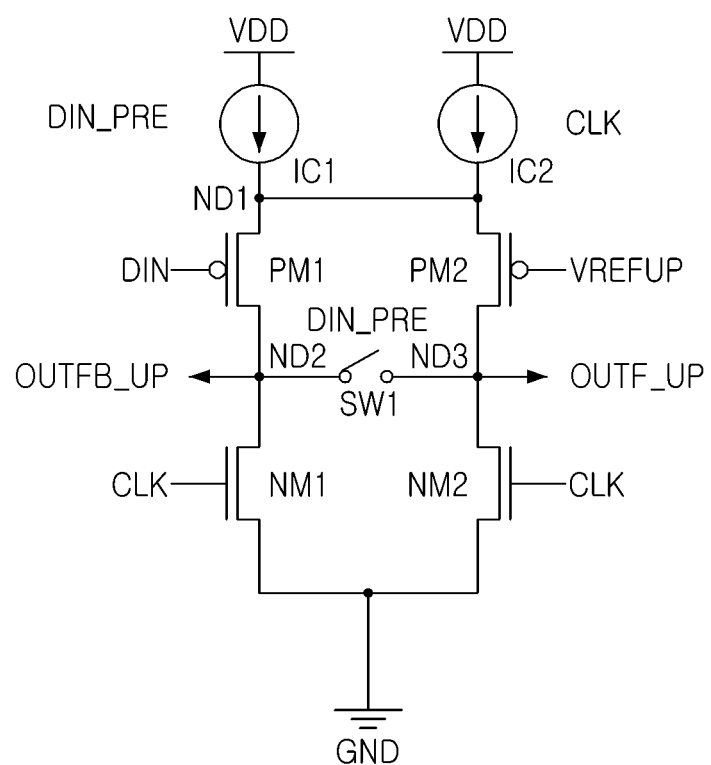
FIGS. 2A and 2B are views illustrating pre-amplifiers according to an example embodiment of the present inventive concept.
Figure 2B:
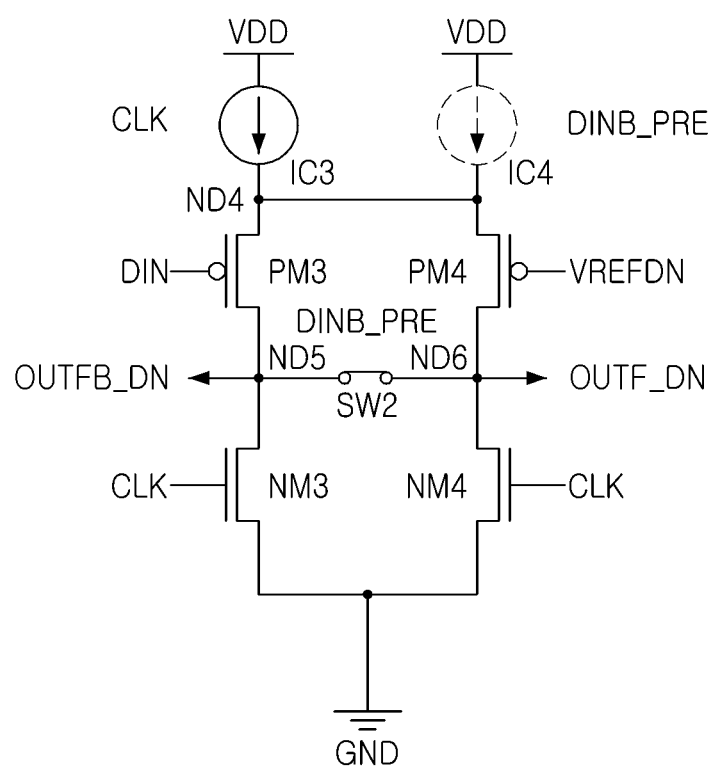

FIGS. 2A and 2B are views illustrating pre-amplifiers 110 and 120 according to an example embodiment of the present inventive concept.

Referring to FIG. 2A, a first pre-amplifier 110 may include current sources IC1 and IC2, p-channel metal oxide semiconductor (PMOS) transistors PM1 and PM2, n-channel metal oxide semiconductor (NMOS) transistors NM1 and NM2, and a first switch SW1.

The first current source IC1 may be connected between a power supply terminal VDD and a first node ND1. The second current source IC2 may be connected between a power supply terminal VDD and a first node ND1.

The first PMOS transistor PM1 may have a source connected to the first node ND1, a drain connected to the second node ND2, and a gate for receiving data DIN. The second PMOS transistor PM2 may have a source connected to the first node ND1, a drain connected to the third node ND3, and a gate for receiving a first reference voltage VREFUP. The first NMOS transistor NM1 may be connected between a second node ND2 and a ground terminal GND in response to a clock CLK. The second NMOS transistor NM2 may be connected between a third node ND3 and a ground terminal GND in response to a clock CLK. The first switch SW1 may connect (or disconnect) the second node ND2 and the third node ND3 in response to the previous data DIN_PRE. Here, differential signals OUTF_UP and OUTFB_UP of the first pre-amplifier 110 may be output from the second node ND2 and the third node ND3.

Meanwhile, a structure of the second pre-amplifier 120 may be implemented in the same manner as the first pre-amplifier 110.

Referring to FIG. 2B, the second pre-amplifier 120 may include current sources IC3 and IC4, PMOS transistors PM3 and PM4, NMOS transistors NM3 and NM4, and a second switch SW2.

The third current source IC3 may be connected between a power supply terminal VDD and a fourth node ND4. The fourth current source IC4 may be connected between a power supply terminal VDD and a fourth node ND4. The third PMOS transistor PM3 may have a source connected to the fourth node ND4, a drain connected to a fifth node ND5, and a gate for receiving data DIN. The fourth PMOS transistor PM4 may have a source connected to the fourth node ND4, a drain connected to a sixth node ND6, and a gate for receiving a second reference voltage VREFDN. The third NMOS transistor NM3 may be connected between a fifth node ND5 and a ground terminal GND in response to a clock CLK. The fourth NMOS transistor NM4 may be connected between a sixth node ND6 and a ground terminal GND in response to a clock CLK. The second switch SW2 may connect (or disconnect) the fifth node ND5 and the sixth node ND6 in response to the previous data DINB_PRE. Here, differential signals OUTF_DN and OUTFB_DN of the second pre-amplifier 120 may be output from the fifth node ND5 and the sixth node ND6.

Meanwhile, the current sources IC1 to IC4 illustrated in FIGS. 2A and 2B may be implemented as (e.g., may comprise) transistors, and the switches SW1 and SW2 may be implemented as (e.g., may comprise) transmission gates.

Figure 3A:
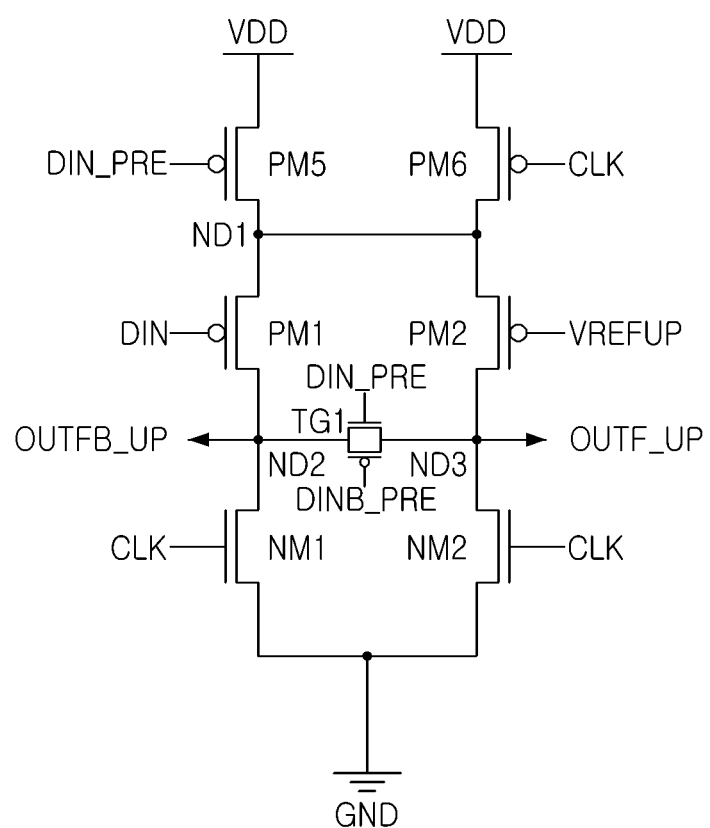
FIGS. 3A and 3B are views illustrating pre-amplifiers of a 3-stack structure.
Figure 3B:
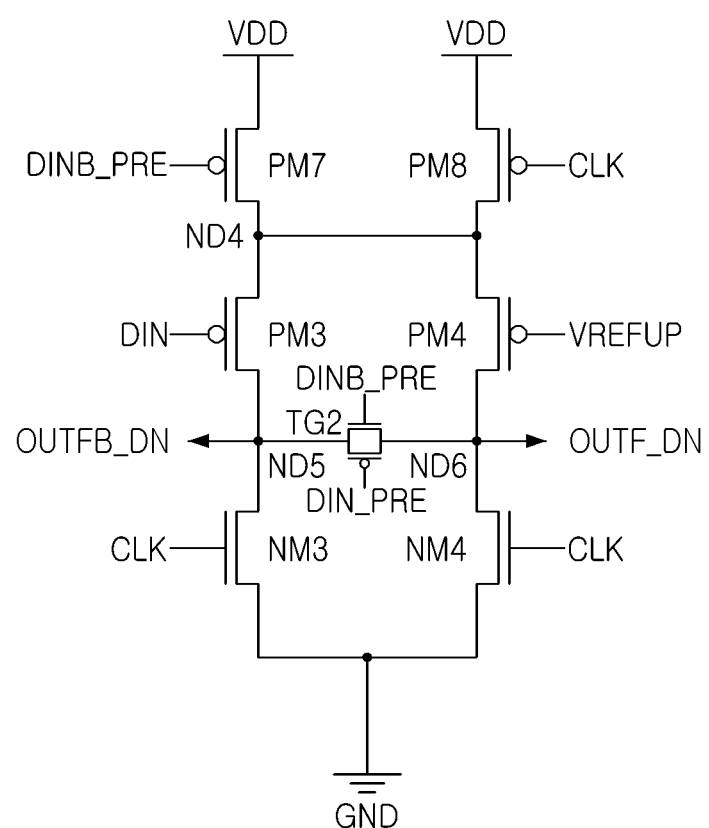

FIGS. 3A and 3B are views illustrating pre-amplifiers 110 and 120 of a 3-stack structure. Accordingly, each of the pre-amplifiers 110 and 120 may have a respective 3-stack transistor structure rather than (i.e., may be free of) any 4-stack transistor structure.

Referring to FIG. 3A, the first pre-amplifier 110 may include PMOS transistors PM1, PM2, PM5, and PM6, NMOS transistors NM1 and NM2, and a first transmission gate TG1.

The first current source IC1 illustrated in FIG. 2A may include a fifth PMOS transistor PM5. Here, the fifth PMOS transistor PM5 may connect the power supply terminal VDD and the first node ND1 in response to the previous data DIN_PRE, thereby supplying current to the first and second PMOS transistors PM1 and PM2. In addition, the second current source IC2 illustrated in FIG. 2A may include a sixth PMOS transistor PM6. Here, the sixth PMOS transistor PM6 may connect the power supply terminal VDD and the first node ND1 in response to the clock CLK, thereby supplying current to the first and second PMOS transistors PM1 and PM2. In addition, the first switch SW1 illustrated in FIG. 2A may include a first transmission gate TG1. Here, the first transmission gate TG1 may connect the second node ND2 and the third node ND3 in response to the previous data DIN_PRE.

Referring to FIG. 3B, the second pre-amplifier 120 may include PMOS transistors PM3, PM4, PM7, and PM8, NMOS transistors NM3 and NM4, and a second transmission gate TG2.

The third current source IC3 illustrated in FIG. 2B may include a seventh PMOS transistor PM7. Here, the seventh PMOS transistor PM7 may connect the power supply terminal VDD and the fourth node ND4 in response to the inverted previous data DINB_PRE, thereby supplying current to the third and fourth PMOS transistors PM3 and PM4. In addition, the fourth current source IC4 illustrated in FIG. 2B may include an eighth PMOS transistor PM8. Here, the eighth PMOS transistor PM8 may connect the power supply terminal VDD and the fourth node ND4 in response to a clock CLK to supply current to the third and fourth PMOS transistors PM3 and PM4. In addition, a second switch SW2 illustrated in FIG. 2B may include a second transmission gate TG2. Here, second transmission gate TG2 may connect the fifth node ND5 and the sixth node ND6 in response to the inverted previous data DINB_PRE.

Meanwhile, the pre-amplifiers 110 and 120 illustrated in FIGS. 3A and 3B may receive the previous data DIN_PRE and DINB_PRE as inputs, and may select one of the input pairs. After opening the corresponding transmission gate, the selected pre-amplifier may output the differential signal to the amplifier 130. On the other hand, after shorting the corresponding transmission gate, the unselected pre-amplifier may filter out the differential signal.

Meanwhile, all of the output of the first stage may be transmitted to the input of the second stage. The structure is a first pre-amplifier stage of the sense amplifier amplifying the data input at a small swing level rail-to-rail. The data low has a signal level obtained by adding a common signal to a differential minus signal, and the data high has a signal level obtained by adding a common signal to a differential plus signal.

The first stage may sense the data input DIN and the reference voltages VREFUP and VREFDN at a CLK falling edge, and amplify a detected voltage difference and transfer the detected voltage difference to a latch of the second stage.

To compensate for ISI, the previous data DIN_PRE, DINB_PRE can activate one of the two input pairs. Activated input pairs can cause a corresponding transmission gate to have a turned off state. As a result, the input signals DIN and VREF may be amplified normally, thereby driving the second stage.

Inactivated input pairs can cause the corresponding transmission gate to have a turned on state. A differential component of the input is therefore not transferred to the output. However, since each of the outputs is pulled up to VDD, it can help drive the circuit itself. In order to transfer the signal of the activated input pairs to a next stage first, the previous data DIN_PRE and DINB_PRE may pre charge the internal node by partially driving a PMOS current source. Thus, differential signals that the transmission gate cannot completely remove may be separated in time.

Meanwhile, the pre amplifier stage of the present inventive concept may select a reference voltage advantageous for sensing according to previous data DIN_PRE and DINB_PRE. In addition, the pre amplifier stage of the present inventive concept is advantageous for driving a low voltage because it does not use a method of selecting a reference voltage by stacking transistors. In addition, input pairs not selected by the DFE do not transfer the differential signal, but may help to increase a bandwidth of a circuit by transferring the common signal used (e.g., required) for driving the next stage.

Figure 4A:
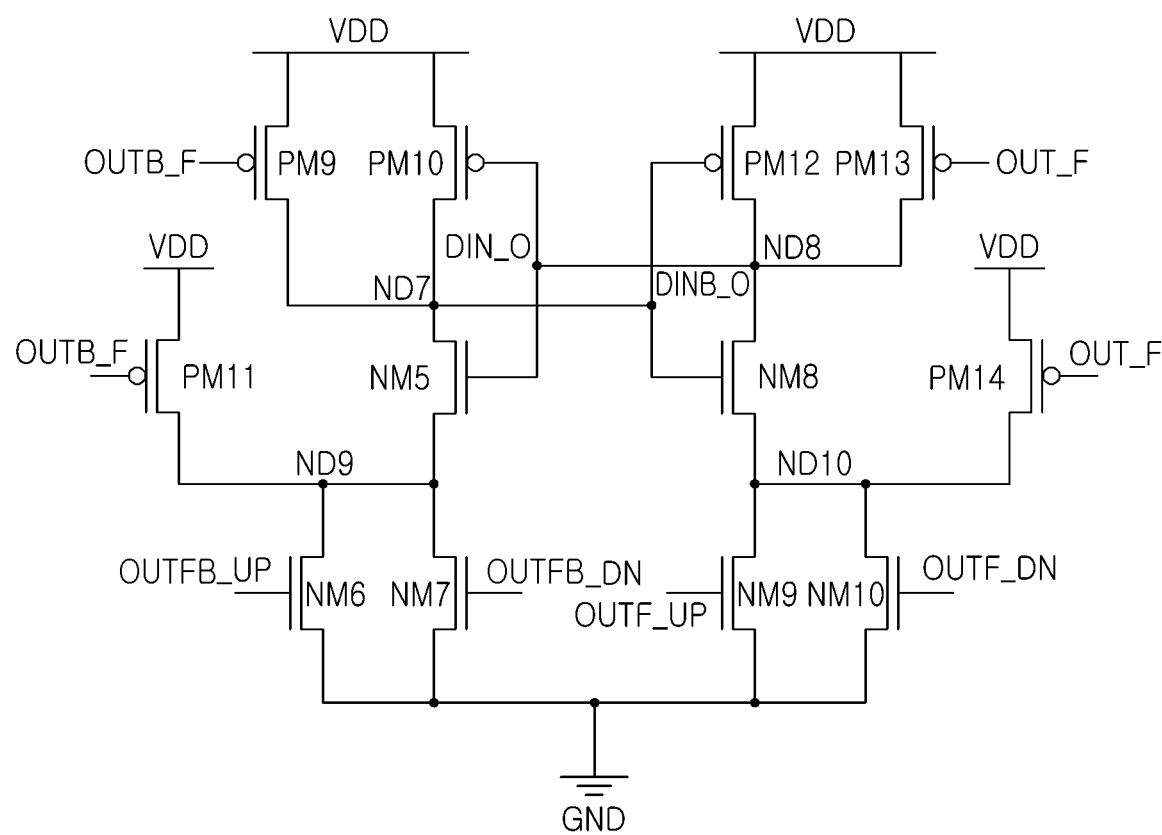
FIG. 4A is a view illustrating an amplifier according to an example embodiment of the present inventive concept.

FIG. 4A is a view illustrating an amplifier 130 according to an example embodiment of the present inventive concept. Referring to FIG. 4A, the amplifier 130 may include PMOS transistors PM9 to PM14 and NMOS transistors NM5 to NM10.

The ninth PMOS transistor PM9 may include a source connected to the power supply terminal VDD, a drain connected to the seventh node ND7, and a gate receiving an inverted feedback output signal OUTB_F. The tenth PMOS transistor PM10 may include a source connected to the power supply terminal VDD, a drain connected to the seventh node ND7, and a gate connected to the eighth node NDB. The eleventh PMOS transistor PM11 may include a source connected to the power supply terminal VDD, a drain connected to the ninth node ND9, and a gate connected to the inverted feedback output signal OUTB_F. The twelfth PMOS transistor PM12 may include a source connected to the power supply terminal VDD, a drain connected to the eighth node ND8, and a gate connected to the seventh node ND7. The thirteenth PMOS transistor PM13 may include a source connected to the power supply terminal VDD, a drain connected to the eighth node ND8, and a gate receiving a feedback output signal OUT_F. The fourteenth PMOS transistor PM14 may include a source connected to the power supply terminal VDD, a drain connected to the tenth node ND10, and a gate connected to the feedback output signal OUT_F.

The fifth NMOS transistor NM5 may include a drain of the tenth PMOS transistor PM10, that is, a drain connected to the seventh node ND7, a source connected to the ninth node ND9, and a gate connected to the eighth node ND8. The sixth NMOS transistor NM6 may include a drain connected to the ninth node ND9, a source connected to the ground terminal GND, and a gate receiving an inverted first differential signal OUTFB_UP. The seventh NMOS transistor NM7 may include a drain connected to the ninth node ND9, a source connected to the ground terminal GND, and a gate receiving an inverted second differential signal OUTFB_DN. The eighth NMOS transistor NM8 may include a drain of the twelfth PMOS transistor PM12, that is, a drain connected to the eighth node ND8, a source connected to the tenth node ND10, and a gate connected to the seventh node ND7. The ninth NMOS transistor NM9 may include a drain connected to the tenth node ND10, a source connected to the power supply terminal GND, and a gate receiving a first differential signal OUTF_UP. The tenth NMOS transistor NM10 may include a drain connected to the tenth node ND10, a source connected to the power supply terminal GND, and a gate receiving a second differential signal OUTF_DN.

Meanwhile, final output signals DIN_0 and DINB_0 of the amplifier 130 may be output from the seventh node ND7 and the eighth node ND8.

The amplifier 130 of the second stage may receive outputs of the first stage OUTF_UP, OUTF_DN, OUTFB_UP, and OUTFB_DN as inputs to drive the latch.

One of OUTF_UP and OUTF_DN can drive the latch differentially with a signal selected by a DFE pass. In addition, the other one thereof may drive a circuit in a common mode, since the first stage is switched on.

The drain of one NMOS transistor may be first pulled-down according to the differential signal resulting from a difference in an input voltage, so that an inverter can be driven first. As the drains of both NMOS transistors may be pulled-down, the output of the cross-coupled latch can be determined. The input signal can be amplified as a signal that finally moves rail-to-rail.

Meanwhile, in the amplifier 130 illustrated in FIG. 4A, each of the ninth PMOS transistor PM9, the eleventh PMOS transistor PM11, the thirteenth PMOS transistor PM13, and the fourteenth PMOS transistor PM14 may provide a power supply voltage to corresponding nodes ND7, NDB, ND9, and ND10 in response to corresponding feedback output signals OUT_F. However, the structure of the amplifier of the present inventive concept is not necessarily limited thereto. The amplifier of the present inventive concept may not include a transistor for performing a reset operation of the node.

Figure 4B:
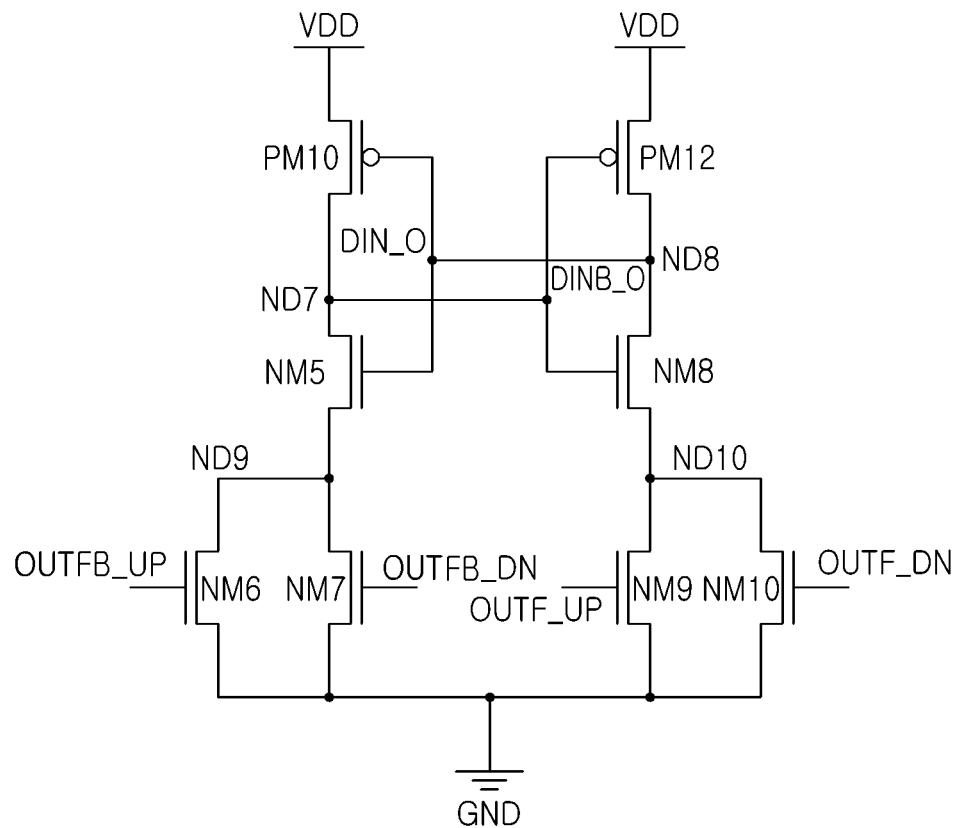
FIG. 4B is a view illustrating an amplifier according to another example embodiment of the present inventive concept.

FIG. 4B is a view illustrating an amplifier 130a according to another example embodiment of the present inventive concept. Referring to FIG. 4B, the amplifier 130a may have a structure in which transistors PM9, PM11, PM13, and PM14, performing a node reset operation, compared to the amplifier 130 illustrated in FIG. 4A, are removed.

A conventional DFE structure compensates for ISI by selectively applying a current to an input transistor of a sense amplifier according to a decision of a loop. However, this method varies current consumption of the sense amplifier according to an input difference and PVT variation. Thus, tap weight of DFE is not relatively constant.

By contrast, the DFE structure according to an example embodiment of the present inventive concept may compensate for ISI by using an input reference voltage, thereby compensating the ISI more effectively and constantly.

Figure 5:
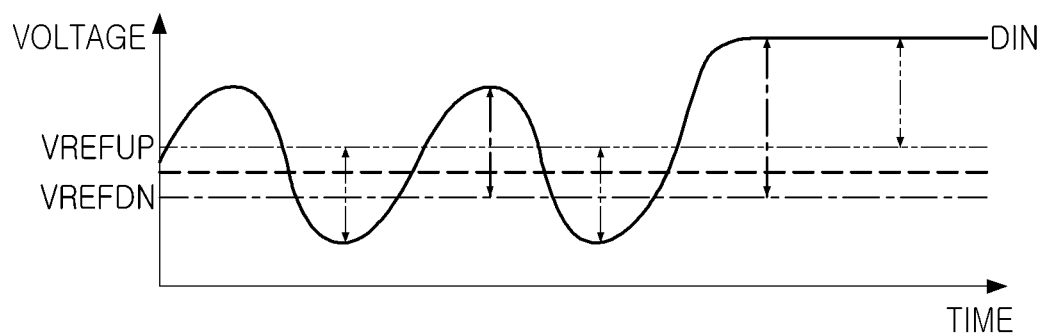
FIG. 5 is a view illustrating an operating timing diagram of the data receiving device according to an example embodiment of the present inventive concept.

FIG. 5 is a view illustrating an operating timing diagram of the data receiving device 100 according to an example embodiment of the present inventive concept. Referring to FIG. 5, in the case of a pattern of a data transition, ISI may be generated due to channel characteristics to cause a low swing. When the input data has an opposite output from the previous data, a reference voltage can be selected to be advantageous.

Figure 6A:
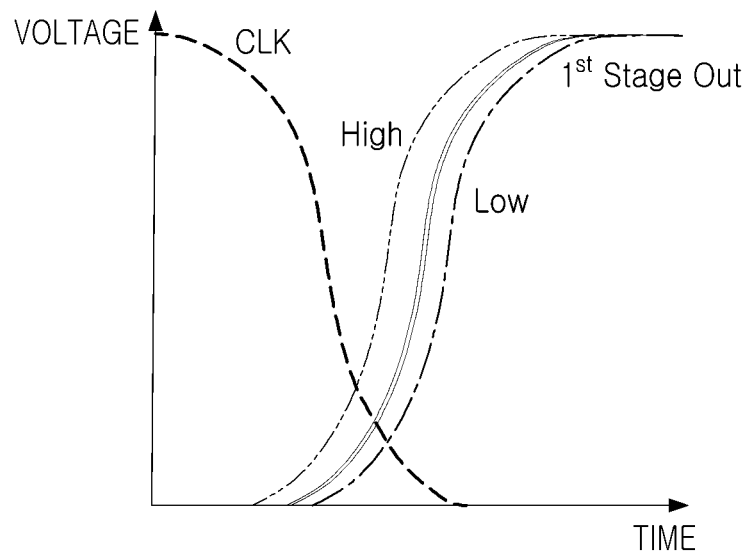
FIG. 6A is a view illustrating an operating timing diagram of a first stage of the data receiving device according to an example embodiment of the present inventive concept.

FIG. 6A is a view illustrating an operating timing diagram of a first stage of the data receiving device 100 according to an example embodiment of the present inventive concept. Referring to FIG. 6A, low/high of the input data DIN may be primarily determined by performing an operation of the first stage at a falling edge of the clock CLK.

Figure 6B:
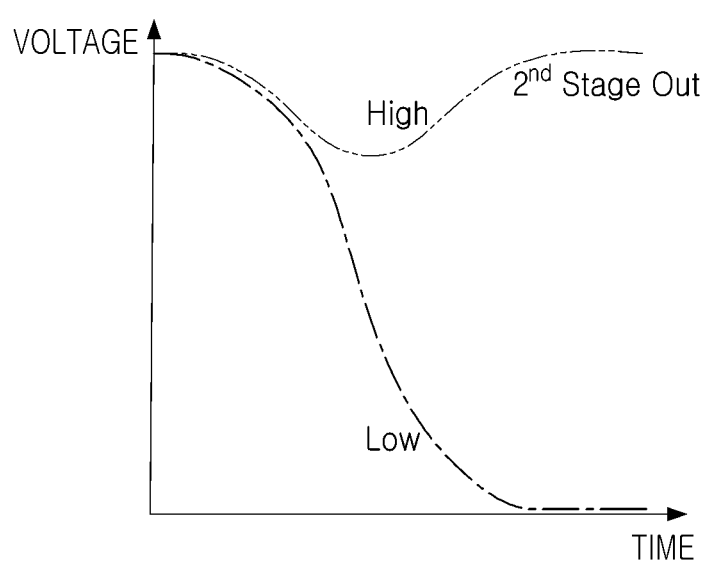
FIG. 6B illustrates an operating timing diagram of a second stage of the data receiving device according to an example embodiment of the present inventive concept.

FIG. 6B is a view illustrating an operating timing diagram of a second stage of a data receiving device 100 according to an example embodiment of the present inventive concept. Referring to FIG. 6B, an operation of the second stage may be performed on the output of the first stage, such that the low/high of the input data DIN may be finally determined. As shown in FIG. 6B, the low or high of the input data DIN can be clearly distinguished.

Meanwhile, the data receiving device 100 according to an example embodiment of the present inventive concept may be applied to a data input sense amplifier DINSA (FIG. 7) of the memory device.

Figure 7:
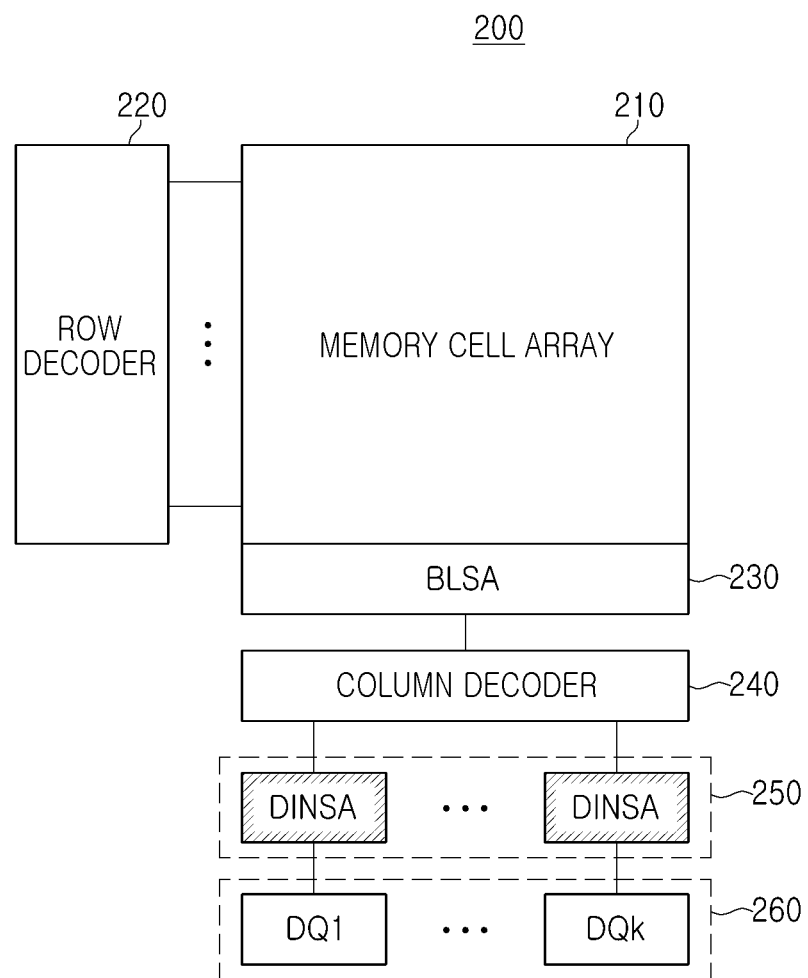
FIG. 7 is a view illustrating a memory device according to an example embodiment of the present inventive concept.

FIG. 7 is a view illustrating a memory device 200 according to an example embodiment of the present inventive concept. Referring to FIG. 7, the memory device 200 includes a memory cell array 210, a row decoder 220, a bit line sense amplifying (BLSA) circuit 230, a column decoder (e.g., column driver) 240, a data input/output circuit 250, and input/output pads 260 (DQ1 to DQk, where k is an integer of 2 or more).

The memory cell array 210 may include at least one bank array. The at least one bank array may include a plurality of memory cells disposed at intersections of the plurality of word lines and the plurality of column lines. In an example embodiment, each of the plurality of memory cells may be a volatile or nonvolatile memory cell.

The row decoder 220 may be configured to select any one of the plurality of word lines in response to the row address. That is, the row decoder 220 may decode a row address output from the address buffer, and select a word line corresponding to the row address in the data write/read mode. The address buffer may receive and store an address having a bank address, a row address, and a column address from an external memory controller. The address register may provide the received bank address to the bank control logic, provide the received row address to the row address multiplexer, and provide the received column address to the column address latch.

The bit line sense amplifying circuit 230 may be configured to sense/amplify data of the selected memory cell. For example, the bit line sense amplifying circuit 230 may sense data by sensing/amplifying the bit line selected by the column decoder 240. In an example embodiment, the bit line sense amplifying circuit 230 may include a plurality of sense amplifiers.

The column decoder 240 may be configured to select a bit line connected to a memory cell in response to a column address. That is, the column decoder 240 may decode a column address output from the address buffer, and may select a bit line corresponding to the column address in a data write/read mode.

The data input/output circuit 250 may receive (amplify and latch) data from an external device through input/output pads DQ1 to DQk during a writing operation, and may transfer the received data to the bit line sense amplifying circuit 230. In addition, the data input/output circuit 250 may receive data sensed by the sense amplifying circuit 230 from memory cells corresponding to an address during a reading operation, and may output the received data to an external device through the input/output pads DQ1 to DQk.

In particular, the data input/output circuit 250 may include a plurality of data input sense amplifiers DINSA and a data input/output buffer.

The data input sense amplifiers DINSA may be implemented by the data receiving device described in FIGS. 1 to 6B and one or more operations thereof.

The data input/output buffer may provide the data DQ to an error correction circuit, based on a clock signal provided from the memory controller during the writing operation, and may provide the data DQ from the error correction circuit to the memory controller during the reading operation. The error correction circuit may generate parity bits, based on data bits of the data DQ provided from the data input/output buffers in a writing operation, and provide a codeword including the data DQ and the parity bits to the data input/output circuit 250. The data input/output circuit 250 may write a codeword to the bank array. In addition, the error correction circuit may receive a codeword read from one bank array from the data input/output circuit 250 in a reading operation. The error correction circuit may perform ECC decoding on the data DQ using the parity bits included in the read codeword and correct at least one error bit included in the data DQ to provide the error bit to the data input/output buffer.

The control logic may be configured to control an overall operation of the memory device 200. The control logic may include a refresh control circuit, a command decoder, and a mode register circuit. The refresh control circuit may receive a refresh signal decoded from the command decoder, and output an internal row address to the row decoder 220 to refresh one word line of the memory cell array 210. A command decoder may receive a command CMD (FIG. 10) from an external device (a memory controller), and may internally generate a command signal (for example, an active signal, a read signal, a write signal, a refresh signal, or the like) decoded from the received command CMD. A mode register circuit may set an internal mode register in response to a mode register set (MRS)/expended mode register set (EMRS) command for designating an operating mode of the memory device 200. In addition, the mode register circuit may output an activation signal responsive to the input/output signal to control an operation of the input/output circuit according to the writing operation/reading operation.

Meanwhile, the data input/output circuit 250 illustrated in FIG. 7 includes one data input sense amplifier DINSA on each input/output pad. However, the present inventive concept will not be limited thereto. The memory device of the present inventive concept may include a plurality of data input sense amplifiers corresponding to one input/output pad.

Figure 8:
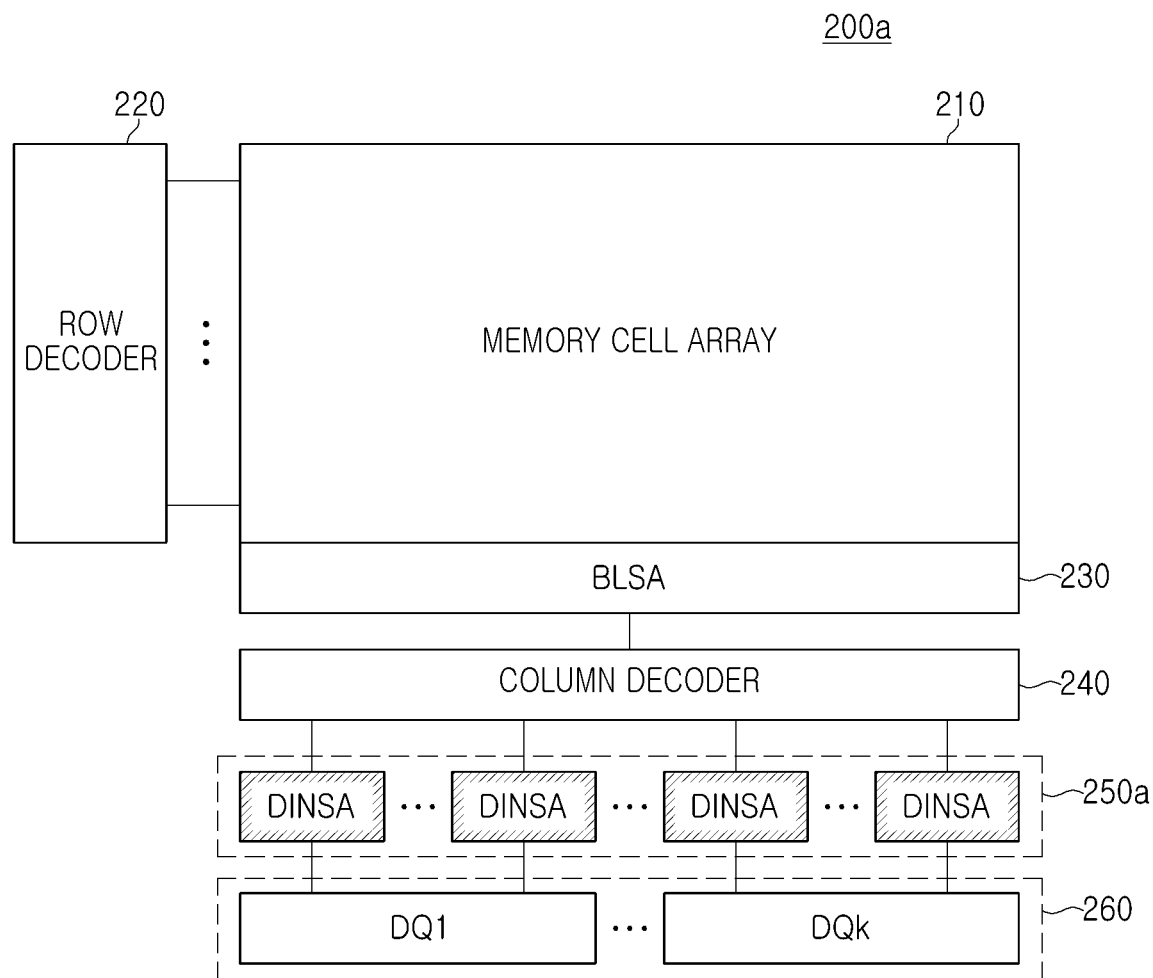
FIG. 8 is a view illustrating a memory device according to another example embodiment of the present inventive concept.

FIG. 8 is a view illustrating a memory device 200a according to another example embodiment of the present inventive concept. Referring to FIG. 8, the memory device 200a includes a data input/output circuit 250a comprising a plurality of data input sense amplifiers DINSA on one data pad as compared with that shown in FIG. 7.

Figure 9:
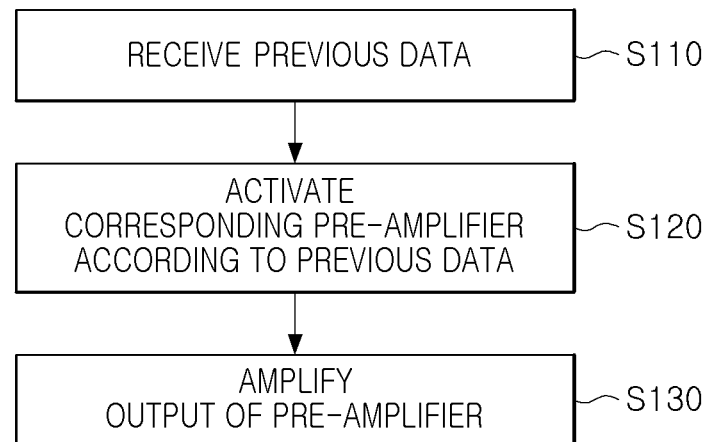
FIG. 9 is a flowchart illustrating an operating method of a data receiving device according to an example embodiment of the present inventive concept.

FIG. 9 is a flowchart illustrating an operating method of a data receiving device according to an example embodiment of the present inventive concept. Referring to FIGS. 1 to 9, an operating method of the data receiving device 100 may proceed as follows.

The first stage (see FIG. 1) of the data receiving device 100 may receive data DIN and previous data DINP_PRE and DINB_PRE in synchronization with the clock CLK (S110). Here, the previous data DIN_PRE and DINB_PRE may be received from another data receiving device. The pre-amplifier of the first stage may be activated/selected according to the received previous data DIN_PRE and DINB_PRE (S120). Thereafter, the second stage (see FIG. 1) of the data receiving device 100 may perform a latching operation of the input data DIN by receiving and amplifying the differential signal from the activated pre-amplifier (S130).

The data receiving device 100 according to an example embodiment of the present inventive concept may include a 2-stage sense amplifier (double-tail sense amplifier) capable of selecting a reference voltage and operating with a low voltage.

The data receiving device 100 according to an example embodiment of the present inventive concept may use a switch to select an input pair and a reference voltage to sense data without a stack of transistors.

The data receiving device 100 according to an example embodiment of the present inventive concept can quickly and reliably proceed to latch driving by charging a differential signal to a node that receives an input pair in a second stage by a current source in advance.

Figure 10:
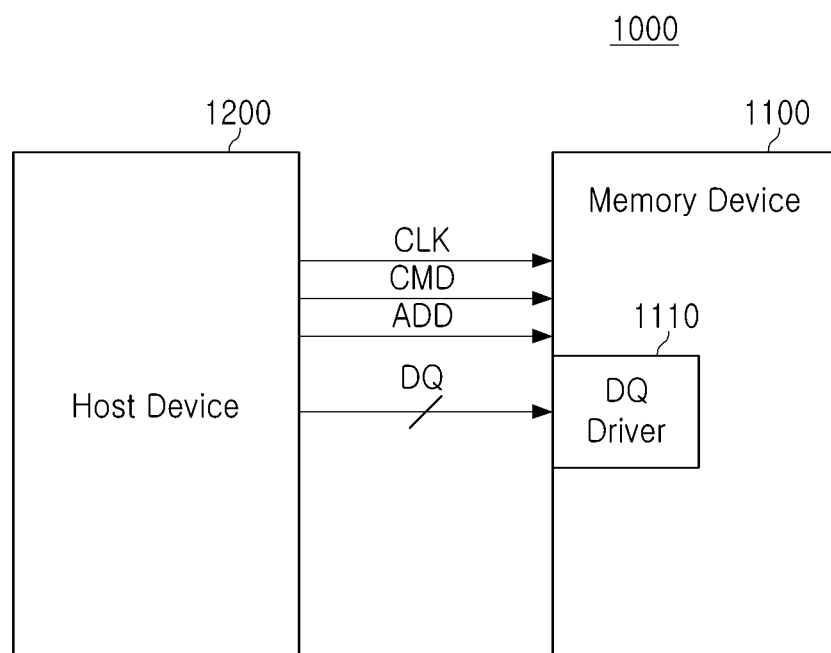
FIG. 10 is a view illustrating a memory system according to an example embodiment of the present inventive concept.

FIG. 10 is a view illustrating a memory system 1000 according to an example embodiment of the present inventive concept. Referring to FIG. 10, the memory system 1000 may include at least one memory device 1100 and a host device 1200 controlling the memory device 1100.

The host device 1200 may transmit a clock CLK, a command CMD, and an address ADD to store data in the memory device 1100 or read data stored in the memory device 1100. The host device 1200 may exchange data with the memory device 1100 through a plurality of data lines DQ. For example, the host device 1200 may be a memory controller or a central processing unit (CPU).

In an example embodiment, the host device 1200 may communicate with the memory device 1100 based on a graphics double data rate (GDDR) interface. However, as the present inventive concept is not limited thereto, the host device 1200 may communicate with the memory device 1100 based on at least one of various interfaces such as a universal serial bus (USB), a multimedia card (MMC), an embedded MMC (eMMC), a peripheral component interconnection (PCI), a PCI express (PCI-E), and an advanced technology attachment (ATA), serial-ATA, parallel-ATA, small computer small interface (SCSI), enhanced small disk interface (ESDI), integrated drive electronics (IDE), fire-wire, a universal flash storage (UFS), a nonvolatile memory express (NVMe), or the like.

The memory device 1100 may store data received through the plurality of data lines DQ according to a control of the host device 1200, or may transmit the stored data to the host device 1200 through the plurality of data lines DQ. In an embodiment, the memory device 1100 may include a dynamic random access memory (DRAM). However, as the present inventive concept is not limited thereto, the memory device 1100 may include at least one of various memory devices such as static RAM (SRAM), dynamic RAM (DRAM), synchronous DRAM (SDRAM), read only memory (ROM), programmable ROM (PROM), electrically programmable ROM (EPROM), Electrically Erasable and Programmable ROM (EEPROM), a flash memory device, phase-change RAM (PRAM), magnetic RAM (MRAM), resistive RAM (RRAM), ferroelectric RAM (FRAM), or the like.

The memory device 1100 may include a data line driver 1110 configured to control each of the plurality of data lines DQ. The DQ driver 1110 may generate a reference voltage or a reference voltage set for determining data provided through each of the plurality of data lines DQ.

In particular, the DQ driver 1110 may be implemented by the data receiving apparatus 100 described in FIGS. 1 to 9 and one or more operations thereof.

Information about the reference voltage of each of the plurality of data lines DQ may be stored in a separate storage circuit (e.g., a code form in a mode register). The DQ driver 1110 may generate an internal code based on the above-described code, and generate a reference voltage or a reference voltage set based on the generated internal code. Codes for the reference voltage of each of the plurality of data lines DQ may be determined during a training process for the memory device 1100.

Figure 11:
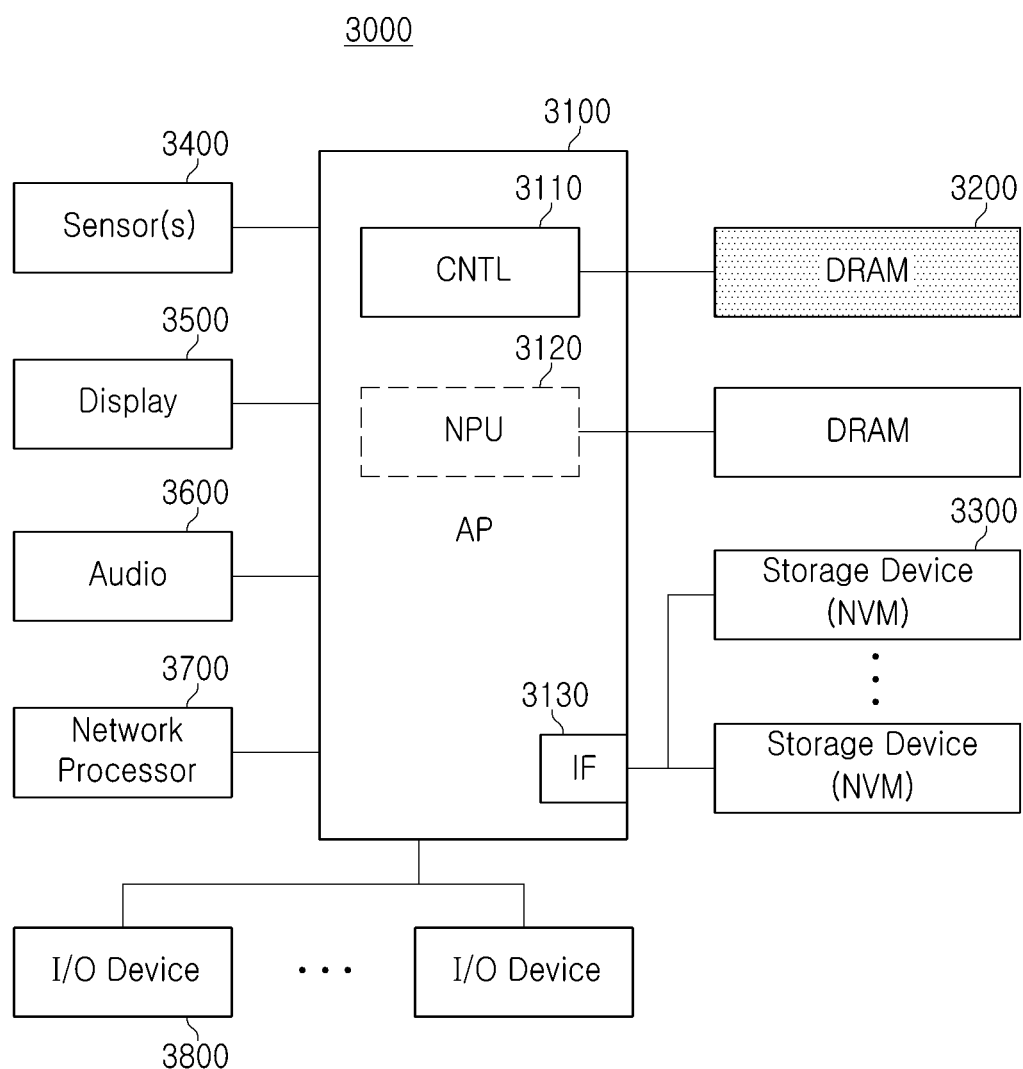
FIG. 11 is a view illustrating a mobile device according to an example embodiment of the present inventive concept.

FIG. 11 is a view illustrating a mobile device 3000 according to an example embodiment of the present inventive concept. Referring to FIG. 11, the mobile device 3000 may include an application processor 3100, at least one DRAM 3200, at least one storage device 3300, at least one sensor 3400, a display device 3500, an audio device 3600, a network processor 3700, and at least one input/output device 3800. For example, the mobile device 3000 may be implemented as a laptop computer, a mobile phone, a smartphone, a tablet personal computer, or a wearable computer.

The application processor 3100 may be configured to control an overall operation of the mobile device 3000. The application processor 3100 may execute applications providing an internet browser, a game, a video, and the like. In an example embodiment, the application processor 3100 may include a single core or a multi-core. For example, the application processor 3100 may include a multi-core such as a dual-core, a quad-core, a hexa-core, and the like. In an embodiment, the application processor 3100 may further include a cache memory located internally or externally.

The application processor (AP) 3100 may include a controller (CNTL) 3110, a neutral processing unit (NPU) 3120, and an interface (IF) 3130. In an embodiment, the NPU 3120 may optionally be provided or omitted.

In an embodiment, the application processor 3100 may be implemented as a system-on-chip (SoC). A kernel of an operating system that is driven on a system-on-chip (SoC) may include an input/output (I/O) scheduler and a device driver for controlling the storage device 3300. The device driver may control an access performance of the storage device 3300 by referring to the number of sync queues managed by the input/output (I/O) scheduler, or may control a CPU mode inside a SoC, a dynamic voltage and frequency scaling (DVFS) level, or the like.

The DRAM 3200 may be connected to the controller 3110. The DRAM 3200 may store data used/necessary for an operation of the application processor 3100. For example, the DRAM 3200 may temporarily store an operating system (OS) and application data, or may be used as an execution space of various software codes.

DRAMs 3200 may be configured to receive data by a two-stage sense amplifier as described in FIGS. 1 to 10. One of the DRAMs 3200 may have a relatively faster latency and bandwidth (BW) than I/O devices or flash memory. The DRAM 3200 may be initialized at the time of mobile power-on, and the OS and application data may be loaded and used as a temporary storage location of the OS and application data, or may be used as an execution space of various software codes. The mobile system performs a multitasking operation of simultaneously loading several applications, and switching between applications and an execution speed can be used as a performance index of the mobile system. A second DRAM 3200 may be connected to NPU 3120. That DRAM 3200 may store data related to artificial intelligence operation(s).

The storage device 3300 may be connected to the interface 3130. In an example embodiment, the interface 3130 may be operated by one communication protocol of DDR, DDR2, DDR3, DDR4, low power DDR (LPDDR), universal Serial bus (USB), a multimedia card (MMC), embedded MIVIC, peripheral component interconnection (PCI), non-volatile memory express (NVMe), peripheral component interconnect express (PCIe), serial advanced technology attachment (SATA), small computer system interface (SCSI), serial attached SCSI (SAS), universal storage bus ((USB) attached SCSI (UAS)), an interne small computer system interface (iSCSI), fiber channel and fiber channel over ethernet (FCoE). In an example embodiment, any one of the storage devices 3300 may be included in the mobile device 3000 in an embedded form. In another example embodiment, any one of the storage devices 3300 may be included in the mobile device 3000 in a detachable manner.

The storage device 3300 may be configured to store user data. For example, the storage device 3300 may store data collected from the sensor 3400, or may store data network data, augmented reality (AR)/virtual reality (VR) data, and high definition (HD) 4K content. The storage device 3300 may include at least one nonvolatile memory device. For example, the storage device 3300 may include a solid state driver (SSD), an embedded multimedia card (eMMC), and the like.

In an example embodiment, the storage device 3300 may be implemented as a separate chip in the application processor 3100, or may be implemented as one package with the application processor 3100.

In an example embodiment, the storage device 3300 may be mounted using various types of packages. For example, the storage device 3300 may be mounted using packages such as a package on package (PoP), ball grid arrays (BGAs), chip scale packages (CSPs), a plastic leaded chip carrier (PLCC), a plastic dual in-line package (PDIP), Die in Waffle Pack, Die in Wafer Form, a chip on board (COB), a ceramic dual in-line package (CERDIP), a plastic metric quad flat pack (MQFP), a thin quad flatpack (TQFP), small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), or the like.

The sensor 3300 may be configured to sense an external environment of the mobile device 3000. In an example embodiment, the sensor 3300 may include an image sensor sensing an image. In this case, the sensor 3300 may transmit the generated image information to the application processor 3100. In another example embodiment, the sensor 3300 may include a biosensor sensing biometric information. For example, the sensor 3300 may sense a fingerprint, an iris pattern, a blood vessel pattern, a heart rate, a blood sugar, and the like, and generate sensing data corresponding to the sensed information. Meanwhile, it should be understood that the sensor 3300 is not limited to the image sensor and the biosensor. The sensor 3300 of the present inventive concept may include any sensor, such as an illuminance sensor, an acoustic sensor, an acceleration sensor, or the like.

The display device 3500 may be configured to output data. For example, the display device 3500 may output image data sensed using the sensor 3300 or output data calculated using the application processor 3100.

The audio device 3600 may be configured to output voice data to the outside (i.e., outside of the mobile device 3000) or detect external voice.

The network processor 3700 may be configured to connect communication with an external device by a wired or wireless communication method The input/output device 3800 may be configured to input data to or output data from the mobile device 3000. The input/output device 3800 may include devices providing digital input and output functions such as an USB or a storage, a digital camera, an SD card, a touch screen, a DVD, a modem, a network adapter, and the like.

A decision feedback equalizer (DFE) circuit according to an example embodiment of the present inventive concept may have a small swing level of the input signal, and the DFE circuit can be applied to a product that needs/benefits from equalizing because ISI is generated by channel characteristics.

The DFE circuit according to an example embodiment of the present inventive concept may use two reference voltages for a 2-stage sense amplifier.

The DFE circuit according to an example embodiment of the present inventive concept may use a differential signal bypassing method through a switch during a selection process of the DFE.

The DFE circuit according to an example embodiment of the present inventive concept may drive a selected input pair in advance by driving a current source according to a DFE decision.

As set forth above, according to an example embodiment of the present inventive concept, a data receiving device, a memory device having the same, and an operating thereof may comprise a two-stage sense amplifier outputting different differential signals according to previous data, thereby improving a data receiving operation.

Various advantages and effects of the present inventive concept are not limited to the above description. While example embodiments have been shown and described above, it will be apparent to those skilled in the art that modifications and variations could be made without departing from the scope of the present disclosure, as defined by the appended claims.

What is claimed is:

1. A data receiving device of a memory device, the data receiving device comprising:
   a first pre-amplifier configured to receive previous data, a first reference voltage, and input data, and to output differential signals by comparing the input data with the first reference voltage in response to a clock, when the first pre-amplifier is selected in response to the previous data;
   a second pre-amplifier configured to receive inverted previous data, a second reference voltage different from the first reference voltage, and the input data, and to output a common signal in response to the clock, when the second pre-amplifier is unselected in response to the previous data; and
   an amplifier configured to receive the differential signals and the common signal, and to latch the input data by amplifying the differential signals.

2. The data receiving device of claim 1,
   wherein the first pre-amplifier is further configured to output a common signal in response to the clock, when the first pre-amplifier is unselected in response to the inverted previous data, and
   wherein the second pre-amplifier is further configured to output differential signals by comparing the input data with the second reference voltage in response to the clock, when the second pre-amplifier is selected in response to the inverted previous data.

3. The data receiving device of claim 1, wherein the first pre-amplifier comprises:
   a first current source connected between a power supply terminal and a first node;
   a second current source connected between the power supply terminal and the first node;
   a first PMOS transistor having a source connected to the first node, a drain connected to a second node, and a gate that is configured to receive the input data;
   a second PMOS transistor having a source connected to the first node, a drain connected to a third node, and a gate that is configured to receive the first reference voltage;
   a first NMOS transistor having a drain connected to the second node, a source connected to a ground terminal, and a gate that is configured to receive the clock;
   a second NMOS transistor having a drain connected to the third node, a source connected to the ground terminal, and a gate that is configured to receive the clock; and
   a first switch configured to disconnect the second node and the third node from each other in response to the previous data, and
   wherein the differential signals are output from the second node and the third node, respectively.

4. The data receiving device of claim 3, wherein the second pre-amplifier comprises:
   a third current source connected between the power supply terminal and a fourth node;
   a fourth current source connected between the power supply terminal and the fourth node;
   a third PMOS transistor having a source connected to the fourth node, a drain connected to a fifth node, and a gate that is configured to receive the input data;
   a fourth PMOS transistor having a source connected to the fourth node, a drain connected to a sixth node, and a gate that is configured to receive the second reference voltage;
   a third NMOS transistor having a drain connected to the fifth node, a source connected to the ground terminal, and a gate that is configured to receive the clock;
   a fourth NMOS transistor having a drain connected to the sixth node, a source connected to the ground terminal, and a gate that is configured to receive the clock; and
   a second switch configured to connect the fifth node and the sixth node to each other in response to the inverted previous data, and
   wherein the common signal is output from the fifth node and the sixth node.

5. The data receiving device of claim 4, wherein each of the first to fourth current sources comprises a respective transistor.

6. The data receiving device of claim 4,
   wherein the first current source includes a fifth PMOS transistor having a source connected to the power supply terminal, a drain connected to the first node, and a gate that is configured to receive the previous data,
   wherein the second current source includes a sixth PMOS transistor having a source connected to the power supply terminal, a drain connected to the first node, and a gate that is configured to receive the clock,
   wherein the third current source includes a seventh PMOS transistor having a source connected to the power supply terminal, a drain connected to the fourth node, and a gate that is configured to receive the inverted previous data, and wherein the fourth current source includes an eighth PMOS transistor having a source connected to the power supply terminal, a drain connected to the fourth node, and a gate that is configured to receive the clock.

7. The data receiving device of claim 4, wherein each of the first and second switches includes a respective transmission gate.

8. The data receiving device of claim 4, wherein the first switch includes a first transmission gate configured to disconnect the second node and the third node from each other in response to the previous data, and wherein the second switch includes a second transmission gate configured to connect the fifth node and the sixth node to each other in response to the inverted previous data.

9. The data receiving device of claim 4, wherein the amplifier includes:

a ninth PMOS transistor having a source connected to the power supply terminal, a drain connected to a seventh node, and a gate that is configured to receive an inverted feedback output signal;

a tenth PMOS transistor having a source connected to the power supply terminal, a drain connected to the seventh node, and a gate connected to an eighth node;

an eleventh PMOS transistor having a source connected to the power supply terminal, a drain connected to a ninth node, and a gate that is configured to receive the inverted feedback output signal;

a twelfth PMOS transistor having a source connected to the power supply terminal, a drain connected to the eighth node, and a gate connected to the seventh node;

a thirteenth PMOS transistor having a source connected to the power supply terminal, a drain connected to the eighth node, and a gate that is configured to receive a feedback output signal;

a fourteenth PMOS transistor having a source connected to the power supply terminal, a drain connected to a tenth node, and a gate that is configured to receive the feedback output signal;

a fifth NMOS transistor having a drain connected to the seventh node, a source connected to the ninth node, and a gate connected to the eighth node;

a sixth NMOS transistor having a drain connected to the ninth node, a source connected to the ground terminal, and a gate that is configured to receive an inverted output signal among the differential signals of the first pre-amplifier;

a seventh NMOS transistor having a drain connected to the ninth node, a source connected to the ground terminal, and a gate that is configured to receive an inverted output signal of the second pre-amplifier;

an eighth NMOS transistor having a drain connected to the eighth node, a source connected to the tenth node, and a gate connected to the seventh node;

a ninth NMOS transistor having a drain connected to the tenth node, a source connected to the ground terminal, and a gate that is configured to receive an output signal among the differential signals of the first pre-amplifier; and a tenth NMOS transistor having a drain connected to the tenth node, a source connected to the ground terminal, and a gate that is configured to receive an output signal of the second pre-amplifier, wherein the input data is latched between the seventh node and the eighth node.

10. The data receiving device of claim 1, wherein the amplifier includes a cross-coupled latch.

11. An operating method of a data receiving device having a first stage and a second stage, the operating method comprising:

receiving input data, previous data, and a reference voltage;

selecting a first pre-amplifier, among a plurality of pre-amplifiers comprising the first pre-amplifier and a second pre-amplifier, in response to the previous data in the first stage;

outputting differential signals from the first pre-amplifier based on the input data, the reference voltage, and a clock; and amplifying the differential signals in the second stage.

12. The operating method of claim 11, wherein the first pre-amplifier comprises a 3-stack transistor structure and is free of any 4-stack transistor structure.

13. The operating method of claim 11, further comprising:

selecting the reference voltage, among a plurality of different reference voltages, in response to the previous data; and connecting or disconnecting two nodes of the first pre-amplifier via a switch in response to the previous data.

14. The operating method of claim 13, further comprising comparing the selected reference voltage with the input data in the first pre-amplifier.

15. The operating method of claim 13, further comprising outputting a common signal to the second stage from the second pre-amplifier in response to the previous data.

16. A data receiving device of a memory device, the data receiving device comprising:

a first pre-amplifier configured to receive previous data, a first reference voltage, and input data, and to output differential signals by comparing the input data with the first reference voltage in response to a clock, when the first pre-amplifier is selected in response to the previous data;

a second pre-amplifier configured to receive inverted previous data, a second reference voltage different from the first reference voltage, and the input data, and to output a common signal in response to the clock, when the second pre-amplifier is unselected in response to the previous data; and an amplifier configured to receive the differential signals and the common signal, and to latch the input data by amplifying the differential signals, wherein the first pre-amplifier comprises a 3-stack transistor structure and is free of any 4-stack transistor structure.

17. The data receiving device of claim 16, wherein the second pre-amplifier comprises a 3-stack transistor structure and is free of any 4-stack transistor structure.

18. The data receiving device of claim 16, wherein the first pre-amplifier is further configured to output a common signal in response to the clock, when the first pre-amplifier is unselected in response to the inverted previous data, and wherein the second pre-amplifier is further configured to output differential signals by comparing the input data with the second reference voltage in response to the clock, when the second pre-amplifier is selected in response to the inverted previous data.

19. The data receiving device of claim 16, wherein the first pre-amplifier comprises:
- a first current source connected between a power supply terminal and a first node;
- a second current source connected between the power supply terminal and the first node;
- a first PMOS transistor having a source connected to the first node, a drain connected to a second node, and a gate that is configured to receive the input data;
- a second PMOS transistor having a source connected to the first node, a drain connected to a third node, and a gate that is configured to receive the first reference voltage;
- a first NMOS transistor having a drain connected to the second node, a source connected to a ground terminal, and a gate that is configured to receive the clock;
- a second NMOS transistor having a drain connected to the third node, a source connected to the ground terminal, and a gate that is configured to receive the clock; and
- a first switch configured to disconnect the second node and the third node from each other in response to the previous data, and
- wherein the differential signals are output from the second node and the third node, respectively.

20. The data receiving device of claim 19, wherein the second pre-amplifier comprises:
- a third current source connected between the power supply terminal and a fourth node;
- a fourth current source connected between the power supply terminal and the fourth node;
- a third PMOS transistor having a source connected to the fourth node, a drain connected to a fifth node, and a gate that is configured to receive the input data;
- a fourth PMOS transistor having a source connected to the fourth node, a drain connected to a sixth node, and a gate that is configured to receive the second reference voltage;
- a third NMOS transistor having a drain connected to the fifth node, a source connected to the ground terminal, and a gate that is configured to receive the clock;
- a fourth NMOS transistor having a drain connected to the sixth node, a source connected to the ground terminal, and a gate that is configured to receive the clock; and
- a second switch configured to connect the fifth node and the sixth node to each other in response to the inverted previous data, and
- wherein the common signal is output from the fifth node and the sixth node.

* * * * *